United States Patent
Shoji

[19]

[11] Patent Number: 6,075,394
[45] Date of Patent: Jun. 13, 2000

[54] PLL CIRCUIT AND RECORDING OR REPRODUCING APPARATUS UTILIZING THE SAME

[75] Inventor: Norio Shoji, Kanagawa, Japan

[73] Assignee: Sony Corporation, Japan

[21] Appl. No.: 09/161,953

[22] Filed: Sep. 29, 1998

Related U.S. Application Data

[62] Division of application No. 08/895,988, Jul. 17, 1997.

[30] Foreign Application Priority Data

Sep. 6, 1996 [JP] Japan .................. P08-236252

[51] Int. Cl.[7] .................................................. H03L 7/06
[52] U.S. Cl. .......................... 327/156; 327/159; 331/17; 331/25; 331/DIG. 2
[58] Field of Search .................................... 327/156, 157, 327/159, 158; 331/1 A, 17–25, DIG. 2

[56] References Cited

U.S. PATENT DOCUMENTS

| | | | |
|---|---|---|---|
| 4,023,116 | 5/1977 | Alfke et al. .................. | 331/17 |
| 4,316,223 | 2/1982 | Baldwin et al. ............. | 360/39 |
| 5,274,681 | 12/1993 | Yamada et al. ............. | 375/118 |
| 5,317,423 | 5/1994 | Harada ........................ | 358/482 |
| 5,384,502 | 1/1995 | Volk ............................. | 327/157 |
| 5,384,774 | 1/1995 | Martin et al. ............... | 370/82 |
| 5,491,439 | 2/1996 | Kelkar et al. ............... | 327/157 |
| 5,619,161 | 4/1997 | Novof et al. ................ | 327/535 |
| 5,670,913 | 9/1997 | Palancar ...................... | 331/4 |
| 5,696,468 | 12/1997 | Nise ............................. | 331/14 |
| 5,740,213 | 4/1998 | Dreyer ........................ | 375/374 |

*Primary Examiner*—Timothy P. Callahan
*Assistant Examiner*—An T. Luu
*Attorney, Agent, or Firm*—Rader, Fishman & Grauer; Ronald P. Kananen

[57] ABSTRACT

In a PLL circuit, the phase of the frequency of an input signal is compared with that of an oscillation frequency generated from a voltage-controlled oscillator. Charge pump circuits are provided which outputs currents pulse-width modulated based on information about the error between the two phases, respectively. An output voltage of a capacitor provided at a stage subsequent to one of the charge pump circuits is converted into a current by a gm amplifier. Further, the converted current is added to an output current of the other charge pump circuit. The so-added output is used as a control input for the voltage-controlled oscillator. The oscillation frequency of the voltage-controlled oscillator is produced as an output signal frequency.

4 Claims, 8 Drawing Sheets

PLL CIRCUIT AND RECORDING OR REPRODUCING APPARATUS UTILIZING THE SAME

This application is a divisional of application Ser. No. 08/895,988 filed Jul. 17, 1997.

BACKGROUND OF THE INVENTION

1. Field of the Invention

The present invention relates to a PLL (Phase Locked Loop) circuit, and a recording or reproducing apparatus such as a hard disk drive (HDD) or the like, in which the PLL circuit is used as a clock recovery circuit for generating a clock, based on reproduce information.

2. Description of the Related Art

A basic configuration of a PLL circuit is shown in FIG. 1. Referring to FIG. 1, a phase comparator 1 compares the phases of an oscillation frequency generated from a voltage-controlled oscillator (VCO) 4 and an input signal frequency and supplies information (UP/DOWN) about the error between the phases to a charge pump circuit 2. The charge pump circuit 2 outputs a current Iout pulse-width modulated based on the phase-error information (UP/DOWN) outputted from the phase comparator 1. The output current Iout is smoothed by a loop filter 3 composed of a capacitor $3c$ and a resistor $3r$. A dc output voltage of the loop filter 3 results in a control voltage for the voltage-controlled oscillator 4 and controls its oscillation frequency.

A transient characteristic of the PLL circuit constructed as described above is represented by a natural angular frequency $\omega n$ and a damping factor $\zeta$. Assuming now that the gain of the charge pump circuit 2 is KI, the gain of the voltage-controlled oscillator 4 is KVCO, the capacitance of the capacitor $3c$ is C and the resistance of the resistor $3r$ is R, the natural angular frequency $\omega n$ and damping factor $\zeta$ are given by the following equations:

$$\omega n = \frac{KI \times KVCO}{C}, \quad \zeta = \frac{C \cdot R}{2} \omega n$$

The natural angular frequency $\omega n$ indicates a loop band of the PLL circuit and simultaneously indicates an Acquisition speed of the PLL circuit. On the other hand, the damping factor $\zeta$ indicates the stability of a loop.

When the input signal frequency varies, the PLL circuit needs to change the natural frequency $\omega n$. When the natural angular frequency $\omega n$ is changed according to the use of the PLL circuit, the gain KI of the charge pump circuit 2 and the gain KVCO of the voltage-controlled oscillator 4 are controlled. At this time, the damping factor $\zeta$ is varied in proportion to the natural angular frequency $\omega n$. Therefore, the time constant CR of the loop filter 3 must be changed to maintain the damping factor $\zeta$ at a predetermined value.

Since the capacitor needs an area in the case of the idea that the PLL circuit is brought into an IC, it is difficult to vary the capacitance C of the capacitor $3c$ upon changing the time constant CR of the loop filter 3. Thus, a configuration has heretofore been adopted in which as shown in FIG. 2, the time constant CR of a loop filter 3 is changed by connecting a plurality of resistors $3r1$, $3r2$ and $3r3$ and a plurality of switches $5s1$, $5s2$ and $5s3$ to a capacitor $3c$ and performing switching between their resistance values under switching control.

However, the conventional PLL circuit constructed as described above is still unfit for the implementation therefore in an IC according to its use because when it is necessary to vary the time constant CR of the loop filter 3 in multistage form, the resistor $3r$ and the switch $3s$ are arranged in large numbers and they must be suitably switching-controlled.

OBJECT AND SUMMARY OF THE INVENTION

An object of the present invention is to provide a PLL circuit suitable for an IC regardless of its use and a recording or reproducing apparatus using the same.

According to one aspect of the present invention, for achieving the above object, there is provided a PLL circuit comprising:

a voltage-controlled oscillator whose oscillation frequency is variable according to a control input;

a phase comparator for comparing the phases of an input signal frequency and the oscillation frequency of the voltage-controlled oscillator;

a first pulse output circuit for outputting a pulse current corresponding to phase-error information outputted from the phase comparator;

a second pulse output circuit for outputting a pulse current corresponding to phase-error information outputted from the phase comparator;

an integration circuit connected between an output terminal of the first pulse output circuit and a reference potential point;

a voltage-to-current conversion circuit for converting an output voltage of the integration circuit into a current; and an adder for adding the output current of the voltage-to-current conversion circuit and the output current of the second pulse output circuit and using the added output as a control input for the voltage-controlled oscillator.

In the PLL circuit constructed as described above, the output voltage of the integration circuit corresponding to a stage subsequent to the first pulse output circuit is converted into the current by the voltage-to-current conversion circuit. Further, the current and the output current of the second pulse output circuit are added together by the adder and the added output of the adder is supplied to the voltage-controlled oscillator as the control input. Thus, a circuit identical to a loop filter of CR can be configured equivalently. By controlling the gain of each of the first and second pulse output circuits and the mutual conductance of the voltage-to-current conversion circuit, a natural angular frequency $\omega n$ can be changed while a damping factor $\zeta$ is being maintained at a predetermined value. Further, only the damping factor $\zeta$ can be changed by controlling the ratio of the output current of the second pulse output circuit to the output current of the first pulse output circuit.

According to another aspect of the present invention, there is provided a recording or reproducing apparatus having a clock recovery circuit for generating a reproduce clock, based on phase information about a reproduce signal read from a recording medium, wherein the PLL circuit constructed as described above is used as the clock recovery circuit.

According to a further aspect of the present invention, there is provided a recording or reproducing apparatus comprising:

a write clock generating circuit for generating a write clock for writing information into a recording medium; and a clock recovery circuit for generating a reproduce clock, based on phase information about a reproduce signal read from the recording medium, and wherein the clock recovery circuit controls the frequency of the reproduce clock according to frequency control information outputted from the write clock generating circuit.

In the recording or reproducing apparatus constructed as described above, since the frequency control information of the write clock generating circuit is used as information for controlling the frequency of the sampling clock generated by the clock recovery circuit, the frequency of the sampling clock is varied so as to follow the frequency of the write clock. Thus, a natural angular frequency ωn proportional to a data rate can be obtained even without special control on the clock recovery circuit side.

The above and other objects, features and advantages of the present invention will become apparent from the following description and the appended claims, taken in conjunction with the accompanying drawings in which preferred embodiments of the present invention are shown by way of illustrative example.

BRIEF DESCRIPTION OF THE DRAWINGS

The present invention will now be described with reference to the accompanying drawings wherein.

DETAILED DESCRIPTION OF THE PREFERRED EMBODIMENTS

Preferred embodiments of the present invention will hereinafter be described in detail with reference to the accompanying drawings.

Figure 3:
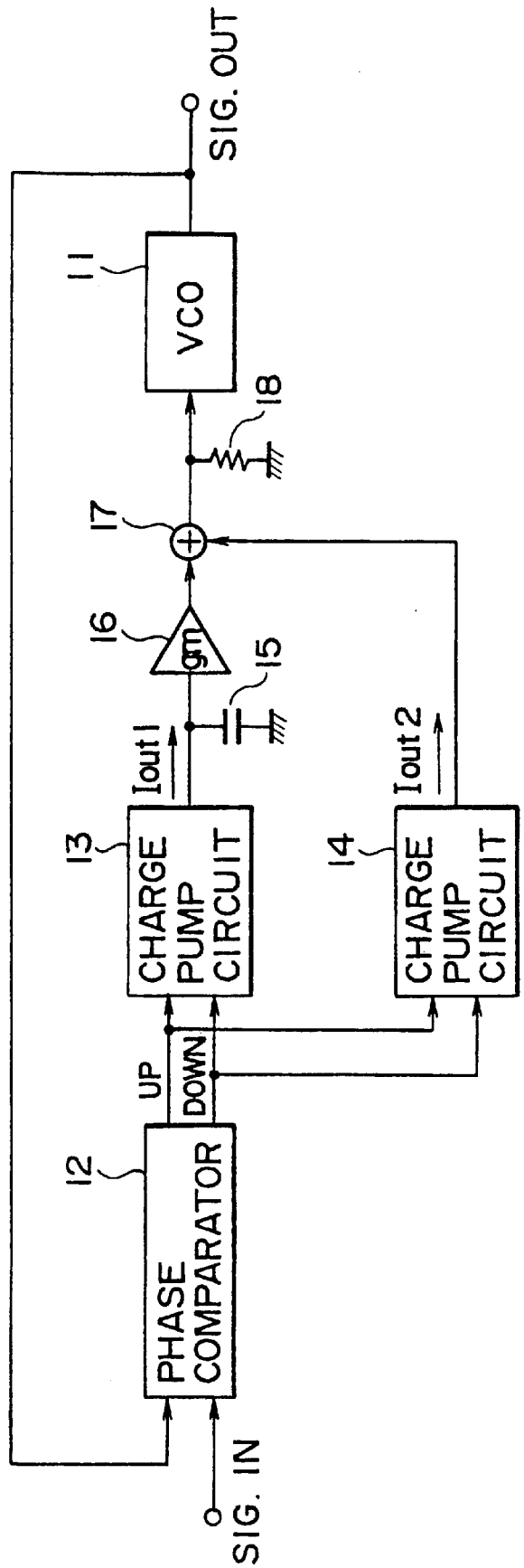
FIG. 3 is a block diagram illustrating a first embodiment of the present invention.

FIG. 3 is a block diagram showing a first embodiment of the present invention. Referring to FIG. 3, a voltage-controlled oscillator (VCO) 11 varies its oscillation frequency according to a control input. The oscillation frequency of the voltage-controlled oscillator 11 is produced as an output signal frequency (Sig. OUT) and used as one input of a phase comparator 12. The phase comparator 12 uses an input signal frequency (Sig. IN) as the other input and compares the phase of the input signal frequency and the phase of the oscillation frequency of the voltage-controlled oscillator 11. Further, the phase comparator 12 supplies phase-error information (UP/DOWN) corresponding to the difference between both phases to charge pump circuits 13 and 14 which serve as first and second pulse output circuits.

The charge pump circuits 13 and 14 output pulse currents Iout1 and Iout2 pulse-width modulated based on the phase-error information (UP/DOWN) outputted from the phase comparator 12. A capacitor 15, which constitutes an integration circuit, is electrically connected between an output terminal of the charge pump circuit 13 and the ground indicative of a reference potential point. Although the capacitor 15 itself is used as the integration circuit in the present embodiment, the integration circuit may be configured by adding other circuit elements to the capacitor 15. An output voltage (corresponding to an voltage across the capacitor 15) of the capacitor 15 is supplied to a gm amplifier 16 which serves as a voltage-to-current conversion circuit. The gm amplifier 16 converts the output voltage of the capacitor 15 into a current and supplies the output current to an adder 17 as one input.

The adder 17 receives the output current (pulse current) Iout2 of the charge pump circuit 14 therein as the other input and adds the output current Iout2 to the output current of the gm amplifier 16. A current outputted from the adder 17 flows in a resistor 18 electrically connected between an output terminal of the adder 17 and the ground. Thus, a dc voltage corresponding to the added current of the adder 17 is developed across the resistor 18. The dc voltage results in a control voltage for the voltage-controlled oscillator 11 and controls its oscillation frequency.

In the PLL circuit according to the first embodiment constructed as described above, the two charge pump circuits 13 and 14 do not necessarily require the same circuit configuration. In the present embodiment, however, the charge pump circuits 13 and 14 will be defined as identical to each other for simplicity of illustration. In doing so, the respective output currents Iout1 and Iout2 of the charge pump circuits 13 and 14 are also represented as Iout1=Iout2.

Figure 4:
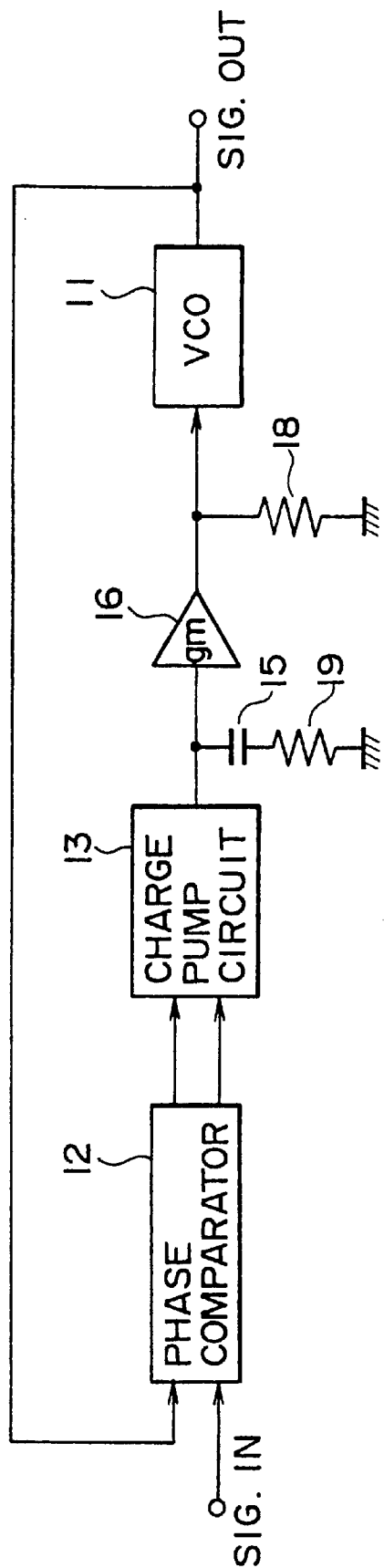
FIG. 4 is a block diagram depicting an equivalent circuit of the first embodiment shown in FIG. 3.

Assuming now that a resistor 19 equivalently exists on the input side of the gm amplifier 16 as shown in FIG. 4, the output current Iout2 of the charge pump circuit 14 is given by the following equation when the value of the resistor 19 is defined as R1 and the mutual conductance of the gm amplifier 16 is defined as gm:

$$Iout1 \times R1 \times gm = Iout2$$

Figure 1:
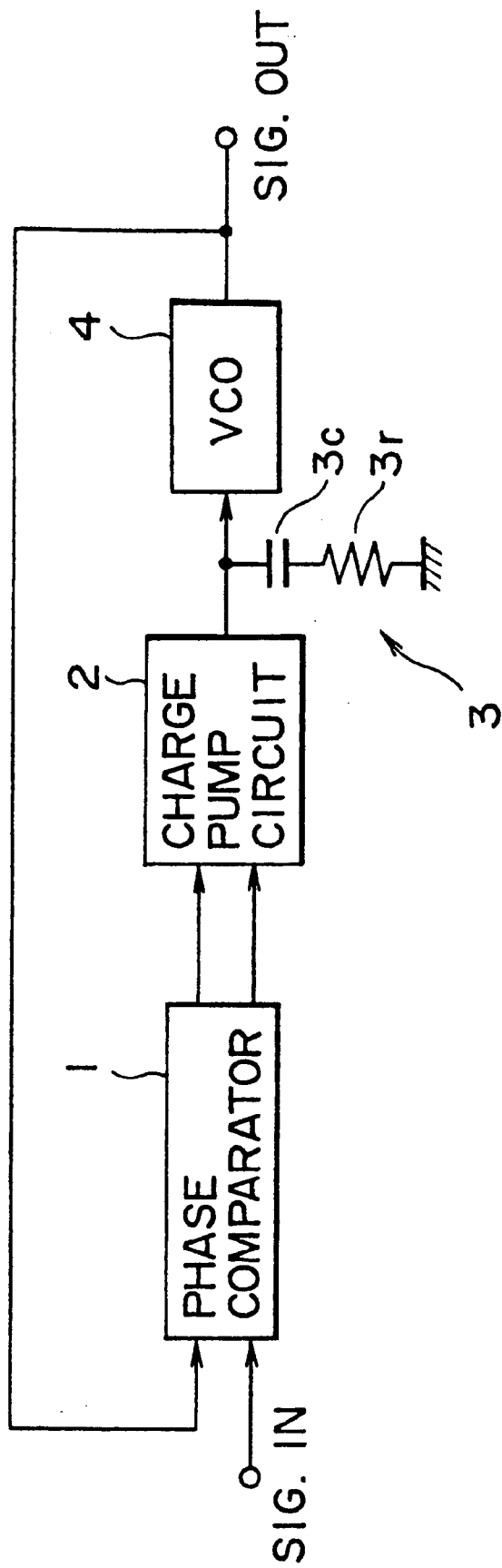
FIGS. 1 and 2 are respectively block diagrams showing basic configurations of PLL circuits illustrative of related arts.
Figure 2:
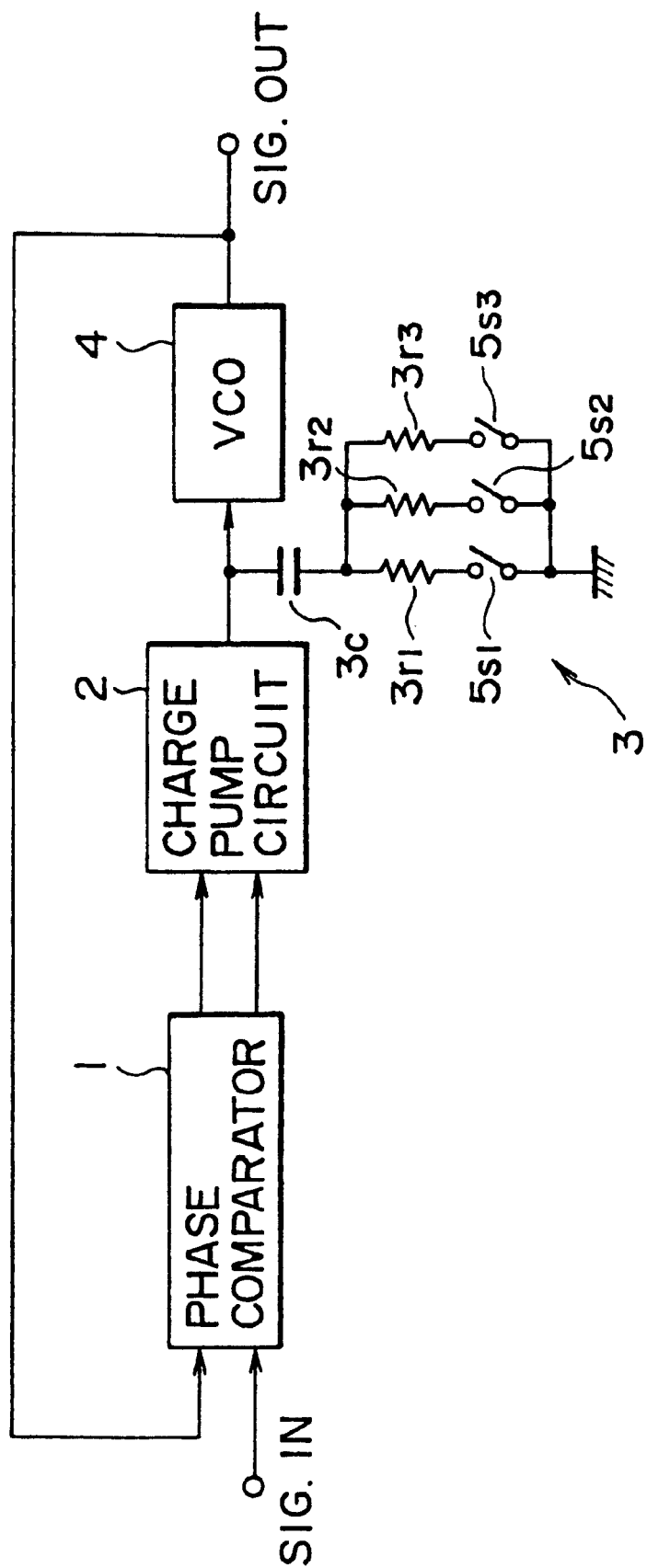

Since Iout1=Iout2, R1 can be expressed as R1=1/gm. Since the equivalent circuit shown in FIG. 2 is identical to a basic circuit shown in FIG. 1, the PLL circuit according to the present embodiment is equivalent to the basic circuit shown in FIG. 1. Thus, the control on the value of the mutual conductance gm of the gm amplifier 16 equivalently allows a change in the value of a resistor 3r and a change in the time constant CR of a loop filter in the basic circuit shown in FIG. 1.

Figure 5:
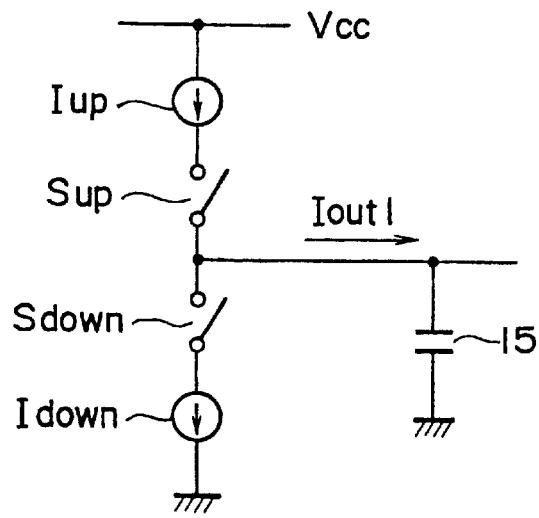
FIG. 5 is a circuit diagram showing one example of a charge pump circuit according to a second embodiment of the present invention.

FIG. 5 is a circuit diagram showing one example of a configuration of a charge pump circuit 13 according to a second embodiment of the present invention. Referring to FIG. 5, a current source Iup and a switch Sup are electrically connected in series between a power supply Vcc and one end of a capacitor 15. Further, a current source Idown and a switch Sdown are electrically connected in series between one end of the capacitor 15 and the ground. A charge pump circuit 14 is also identical in circuit configuration to the charge pump circuit 13.

When the phase-error information UP is supplied from the phase comparator 12 to the charge pump circuit 15 constructed as described above, the switch Sup is switching-controlled according to the phase-error information UP. On the other hand, when the phase-error information DOWN is supplied to the charge pump circuit 13 from the phase comparator 12, the switch Sdown is switching-controlled according to the phase-error information DOWN. As a result, the charge pump circuit 13 outputs a pulse-width modulated pulse current Iout1 therefrom. Similarly, the charge pump circuit 14 also outputs a pulse current Iout2 pulse-width modulated based on the phase-error information (UP/DOWN).

Figure 6:
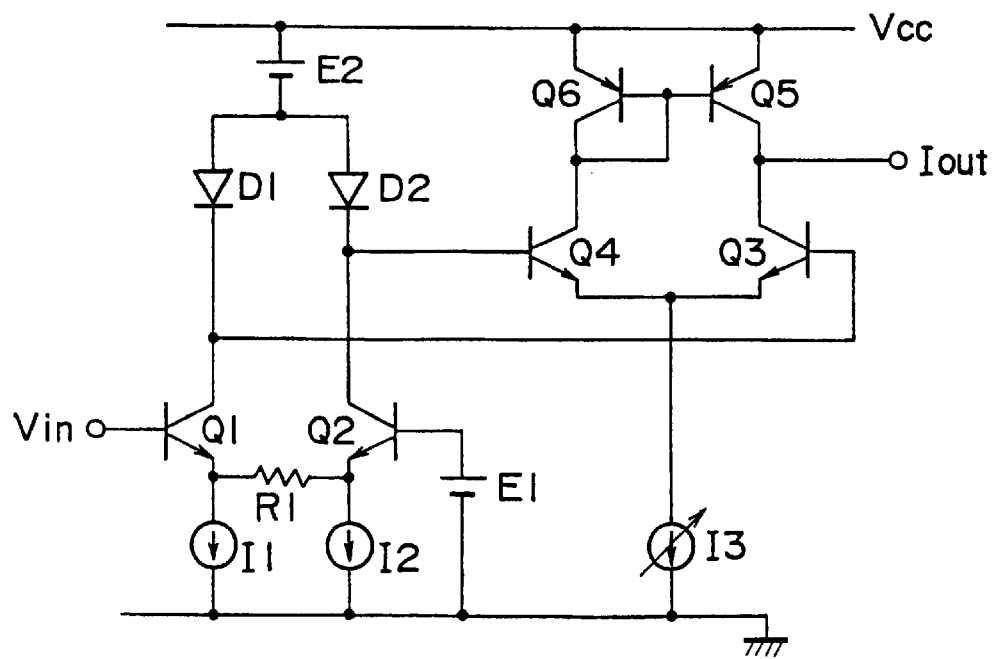
FIG. 6 is a circuit diagram illustrating one example of a gm amplifier according to a third embodiment of the present invention.

FIG. 6 is a circuit diagram showing one example of a configuration of a gm amplifier 16 according to a third embodiment of the present invention. Referring to FIG. 6, the emitters of transistors Q1 and Q2 are electrically connected to one another through a resistor R1. Further, the emitters thereof are electrically connected to the ground through current sources I1 and I2 respectively. An input voltage Vin is applied to the base of the transistor Q1 and a predetermined voltage E1 is applied to the base of the transistor Q2. The cathodes of diodes D1 and D2 are electrically connected to the collectors of the transistors Q1 and Q2 respectively. A voltage lower than a voltage of a power supply Vcc by E2 is applied to the anodes of the diodes D1 and D2.

The bases of transistors Q3 and Q4 are electrically connected to the collectors of the transistors Q1 and Q2 respectively. The emitters of the transistors Q3 and Q4 are electrically connected to each other and are coupled to the ground through a variable current source I3. The collectors of transistors Q5 and Q6 are electrically connected to the collectors of the transistors Q3 and Q4 respectively. The emitters of the transistors Q5 and Q6 are electrically connected to the power supply Vcc.

A current mirror circuit is configured by electrically connecting the bases of the transistors Q5 and Q6 to one another and electrically connecting the base and collector of the transistor Q6 to each other. An output current Iout is produced from a point where the collectors of the transistors Q3 and Q5 are connected in common to each other. Thus, the gm amplifier 16 of a Gilbert multiplier configuration is constructed. When the current of the variable current source I3 is represented as Icont in the gm amplifier 16 constructed as described, gm  Icont.

Assuming that in the PLL circuit shown in FIG. 3, the gain of each of the charge pump circuits 13 and 14 is defined as KI, the gain of the voltage-controlled oscillator 11 is defined as KVCO, the capacitance of the capacitor 15 is defined as C and the resistance of the resistor 18 is defined as R2, a natural angular frequency ωn and a damping factor ζ are given by the following equations:

$$\omega n = \frac{KI \times gm \times R2 \times KVCO}{C}$$

$$\zeta = \frac{C \cdot R2}{2} \omega n = \frac{C}{2} \times \frac{1}{gm} \omega n$$

When KI=KI'×K, gm=gm'×K(KI', gm' are constant and K is a constant), the natural angular frequency ωn is changed as the following equation by controlling the gain KI of each of the charge pump circuits 13 and 14 and the mutual conductance gm of the gm amplifier 16 to the same:

$$\omega n = K \frac{KI' \times gm' \times R2 \times KVCO}{C} = K \cdot \omega n'$$

Namely, the natural angular frequency ωn linearly varies according to the value of K. On the other hand, the damping factor ζ is given by the following equation:

$$\zeta = \frac{C}{2} \frac{1}{gm} \omega n = \frac{C}{2} \frac{1}{K \cdot gm'} K \cdot \omega n' = \frac{C}{2} \frac{1}{gm'} \omega n'$$

Since gm varies inversely with the natural angular frequency ωn even if the natural angular frequency ωn is varied, becomes constant.

In order to control the gain KI of each of the charge pump circuit 13 and 14, the current sources Iup and Idown may be varied in the circuit shown in FIG. 5. In order to control the mutual conductance gm, the current Icont of the current source I3 may be varied in the circuit shown in FIG. 6. Thus, the gain KI of each of the charge pump circuits 13 and 14 and the mutual conductance gm can be easily controlled. The natural angular frequency wn can be varied while the damping factor ζ is being maintained at a given value, by controlling the gain and the mutual conductance.

The present embodiment has described the case in which the natural angular frequency ωn is varied by controlling the gain KI of each of the charge pump circuits 13 and 14 and the mutual conductance gm. However, there may be a case in which it is desired to hold the natural angular frequency ωn constant and vary only the damping factor ζ according to the use of the present PLL circuit. In this case, the pulse current Iout2 of the charge pump circuit 14 may be varied.

Namely, Iout1=Iout2 in the above-described embodiment. However, R1=K/gm in the equivalent circuit of FIG. 4 showing the third embodiment of the present invention if Iout2 is set to K (K: arbitrary number) times the current Iout1, i.e., Iout2=KIout1. Therefore, if the mutual conductance gm is fixed, then only the damping factor ζ can be varied by controlling the ratio K of the pulse current Iout2 of the charge pump circuit 14 to the pulse current Iout1 of the charge pump circuit 13.

Figure 7:
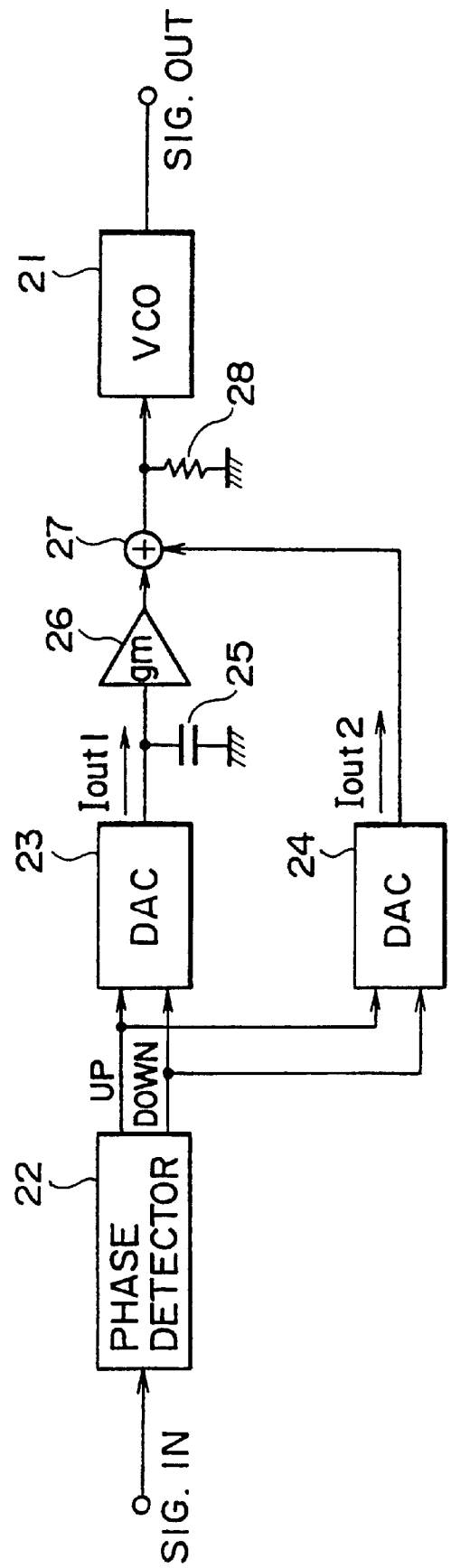
FIG. 7 is a block diagram depicting a fourth embodiment of the present invention.

FIG. 7 is a block diagram showing a fourth embodiment of the present invention. Referring to FIG. 7, a voltage-controlled oscillator (VCO) 21 varies its oscillation frequency according to a control input. The oscillation frequency of the voltage-controlled oscillator 21 is produced as an output signal frequency (Sig. OUT). A phase detector 22 digitally extracts phase information about an input signal (Sig. IN) and supplies the phase information (UP/DOWN) to DA converters (DAC) 23 and 24 respectively corresponding to first and second pulse output circuits.

The DA converters 23 and 24 output pulse currents Iout1 and Iout2 whose peak or crest values (pulse heights) are varied according to the phase information (UP/DOWN) outputted from the phase detector 22. A capacitor 25, which constitutes an integration circuit, is electrically connected between an output terminal of the DA converter 23 and the ground. Although the capacitor 25 itself is used as the integration circuit in the present embodiment, the integration circuit may be configured by adding other circuit elements to the capacitor 25. An output voltage (corresponding to a voltage across the capacitor 25) of the capacitor 25 is supplied to a gm amplifier 26. The gm amplifier 26 converts the output voltage of the capacitor 25 into a current and supplies the converted output current to an adder 27 as one input.

The adder 27 receives the output current (pulse current) Iout2 of the DA converter 24 therein as the other input and adds the output current Iout2 to the current converted by the gm amplifier 26. The so-added current of the adder 27 flows in a resistor 28 electrically connected between an output terminal of the adder 27 and the ground. Thus, a dc voltage corresponding to the added current of the adder 27 is developed across the resistor 28. The dc voltage results in a control voltage for the voltage-controlled oscillator 21 and controls the oscillation frequency of the voltage-controlled oscillator 21.

The PLL circuit according to the fourth embodiment of the present invention is different from that according to the first embodiment in that the DA converters 23 and 24 for outputting the pulse currents Iout1 and Iout2 having the crest values according to the phase information (UP/DOWN) outputted from the phase detector 22 are used. However, the present embodiment is identical in basic operation to the first embodiment.

Namely, a natural angular frequency ωn can be varied while a damping factor ζ is being maintained at a given value, by controlling the gain KI of each of the DA converters 23 and 24 and the mutual conductance gm of the gm amplifier 26. On the other hand, only the damping factor ζ can be varied by controlling the ratio K between the pulse current Iout1 of the DA converter 23 and the pulse current Iout2 of the DA converter 24.

Figure 8:
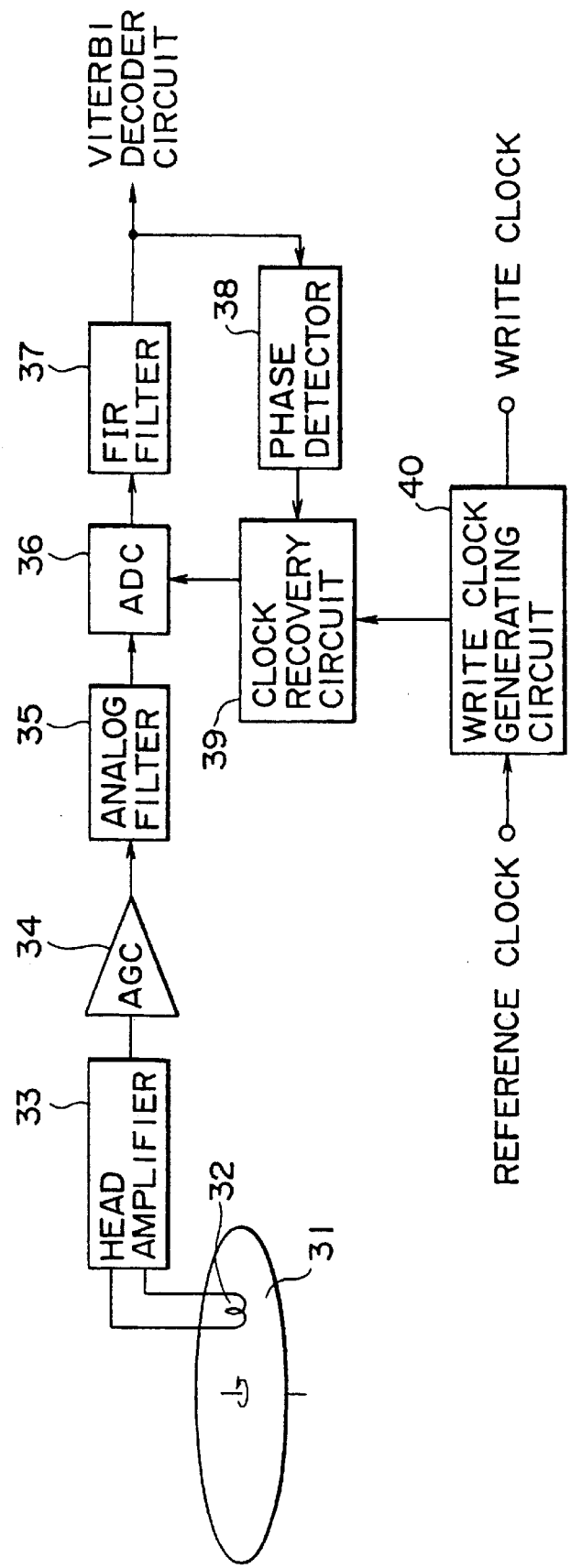
FIG. 8 is a block diagram showing one example of a configuration of an HDD signal processing system according to a fifth embodiment of the present invention.

The PLL circuit showing a fifth embodiment of the present invention, which has been described above, is used as a clock recovery circuit employed in a signal processing system of a recording or reproducing apparatus such as a hard disk drive (hereinafter called "HDD" (Hard Disk Drive)). FIG. 8 is a block diagram showing one example of a configuration of the signal processing system of the HDD.

Referring to FIG. 8, the recording or reproducing of information on and from a hard disk 31 (hereinafter called merely "disk 31") corresponding to a recording medium is performed by a magnetic head 32. A signal read from the disk 31 by the magnetic head 32 passes through a head amplifier 33 and is thereafter amplified by an AGC (Automatic Gain Control) amplifier 34 until the amplitude thereof becomes constant. A signal outputted from the AGC amplifier 34 is waveform-shaped by an analog filter 35 and thereafter converted into digital data by an AD converter (ADC) 36. The digital data passes through an FIR (Finite Impulse Response) filter 37 and is thereafter supplied to a viterbi decoder circuit (not shown) where it is decoded and supplied to a phase detector 38.

The phase detector 38 digitally extracts phase information from the digital data inputted thereto and supplies it to a clock recovery circuit 39. The clock recovery circuit 39 generates a clock, based on the phase information corresponding to the digital data supplied from the phase detector 38 and supplies the clock to the AD converter 36 as its sampling clock (reproduce clock). The PLL circuit according to the previously-described first or second embodiment is used as the clock recovery circuit 39.

On the other hand, a write clock generating circuit 40 generates a write clock for modulating data upon recording it on the disk 31, based on a reference clock supplied from a crystal oscillator or the like. The write clock generating circuit 40 is also constructed of a PLL circuit as will be described later.

On the other hand, since the number of revolutions of a hard disk is constant when the HDD is used, the inner and outer peripheries of the hard disk are different in linear velocity from each other. Namely, the linear velocity at the outer periphery of the hard disk is slower than that at the inner periphery thereof. Thus, since a track recording density of the outer periphery allows for that of the inner periphery, the hard disk adopts an approach for separating it into zones in its radial direction and recording information by changing the frequency of a write clock every zones.

Thus, in the write clock generating circuit 40, a programmable frequency divider is placed in a PLL loop as will be described later and a division ratio of the programmable frequency divider is controlled based on externally-supplied zone information, whereby the frequency of the write clock is varied every zones to be written. In contrast with this, the clock recovery circuit 39 also needs to change the frequency of a reproduce clock, i.e., the sampling clock of the AD converter 36 for each zone.

Upon changing the frequency of the sampling clock every zones, the present invention adopts a configuration using frequency control information at the time that the write clock generating circuit 40 controls the frequency of the write clock for each zone. Namely, the clock recovery circuit 39 is configured so as to control the frequency of the sampling clock according to the frequency control information of the write clock generating circuit 40.

Specific configurations of the clock recovery circuit 39 and the write clock generating circuit 40 in FIG. 8 at the time that, for example, the PLL circuit according to the fourth embodiment is used as the clock recovery circuit 39, will now be described with reference to a block diagram shown in FIG. 9.

Figure 9:
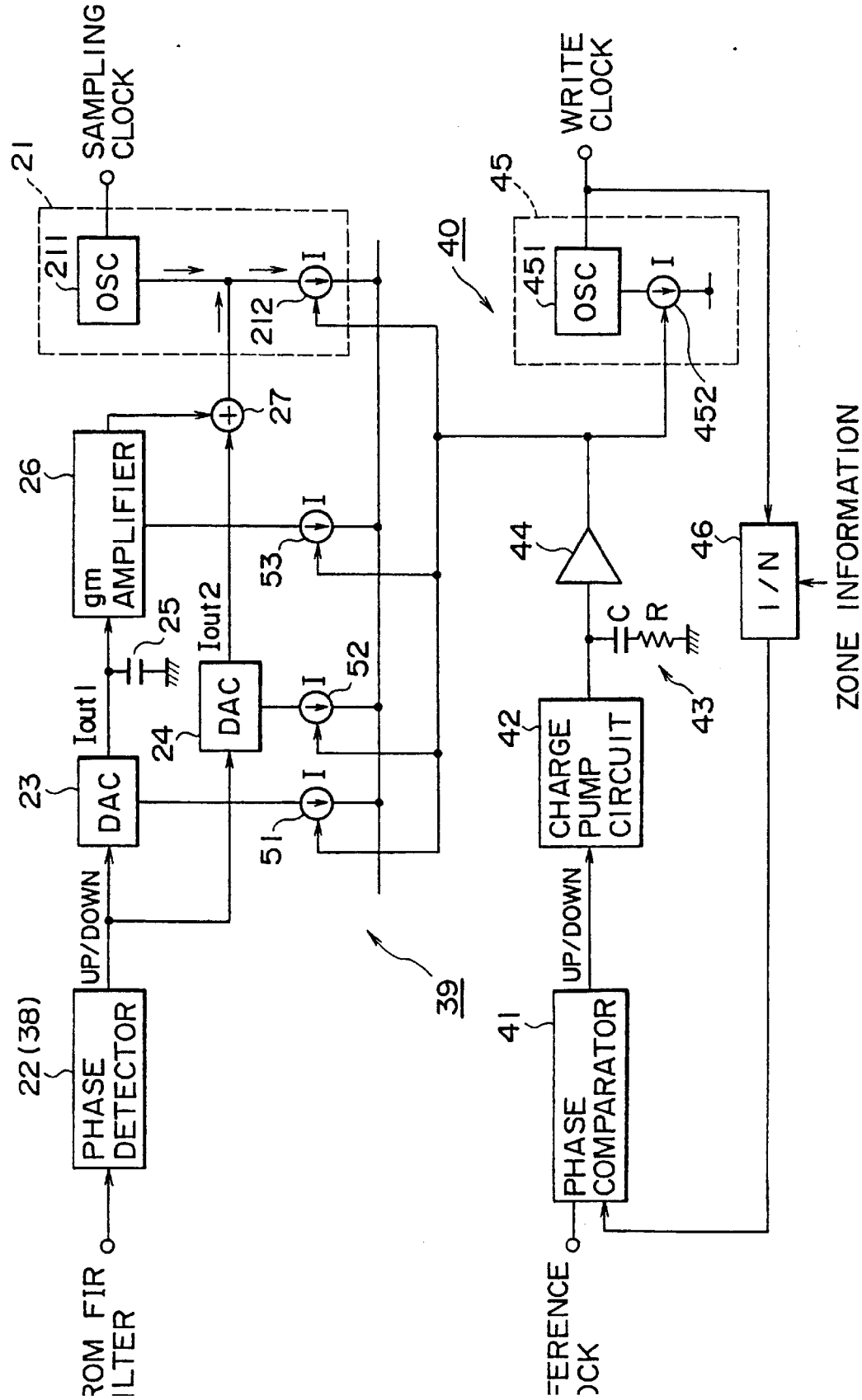
FIG. 9 is a block diagram illustrating examples of a clock recovery circuit according to a sixth embodiment of the present invention and a write clock generating circuit.

Referring to FIG. 9, a clock recovery circuit 39 according to a sixth embodiment of the present invention is basically identical to the PLL circuit according to the fourth embodiment shown in FIG. 7. Namely, the clock recovery circuit 39 comprises a phase detector 22 (corresponding to the phase detector 38 shown in FIG. 8) for digitally detecting phase information about the digital signal supplied from the FIR filter 37 shown in FIG. 8, DA converters 23 and 24 for respectively outputting pulse currents Iout1 and Iout2 having crest values corresponding to the phase information (UP/DOWN) outputted from the phase detector 22, a capacitor 25 electrically connected between an output terminal of the DA converter 23 and the ground, a gm amplifier 26 for converting an output voltage of the capacitor 25 to a current, an adder 27 for adding the output current of the gm amplifier 26 and an output current of the DA converter 24, and a voltage-controlled oscillator 21 whose oscillation frequency is variable according to the so-added output of the adder 27.

On the other hand, a write clock generating circuit 40 comprises a phase comparator 41 using a reference clock as one input, a charge pump circuit 42 for outputting a current pulse-width modulated according to phase-error information (UP/DOWN) outputted from the phase comparator 41, a CR loop filter 43 for smoothing the output current of the charge pump circuit 42, a buffer 44 of a stage subsequent to the loop filter 43, a voltage-controlled oscillator 45 for receiving, as a control input, the output of the loop filter 43, which is supplied through the buffer 44, and a programmable frequency divider 46 for dividing an oscillation frequency of the voltage-controlled oscillator 45 into 1/N.

As previously mentioned, the write clock generating circuit 40 having the above construction controls a division ratio N of the programmable frequency divider 46 based on zone information supplied from the outside to thereby vary the frequency of a write clock every zones to be written. At this time, the output of the loop filter 43, which is obtained through the buffer 44, is supplied to the voltage-controlled oscillator 45 as frequency control information for controlling its oscillation frequency. The frequency control information controls a current I of a current source 452 of an oscillator (OSC) 451 in the voltage-controlled oscillator 45.

Further, the frequency control information is also supplied to the clock recovery circuit 39 as information for controlling the frequency of a sampling clock generated by the clock recovery circuit 39. In the clock recovery circuit 39, respective currents I of current sources 51 and 52 for the DA converters 23 and 24, a current I of a current source 53 for the gm amplifier 26 and a current I of a current source 212 of an oscillator 211 in the voltage-controlled oscillator 21 are controlled by the frequency control information supplied from the write clock generating circuit 40.

As described above, the frequency control information serving as the control input of the voltage-controlled oscillator 45 in the write clock generating circuit 40 is used upon changing the frequency of the sampling clock generated by the clock recovery circuit 39 every zones. Thus, since the frequency of the sampling clock varies so as to follow the frequency of the write clock, a natural angular frequency ωn proportional to a data rate can be obtained even without special control on the clock recovery circuit 39 side.

Incidentally, the present embodiment has described the case in which the PLL circuit according to the fourth embodiment is used as the clock recovery circuit 39 for generating the reproduce clock. It is however needless to say that the present embodiment can be applied in the same manner as described above even when the PLL circuit according to the first embodiment is used as the clock recovery circuit 39. In this case, the charge pump circuits 13 and 14 may be configured so that the currents of the current sources Iup and Idown shown in FIG. 5 are controlled by the frequency control information supplied from the write clock generating circuit 40. Further, the gm amplifier 16 may be configured so that the current of the current source I3 shown in FIG. 6 is controlled by the frequency control information.

A description has been made of the case in which the present invention is applied to the clock recovery circuit of the HDD. However, the present invention is not necessarily limited to the application to the HDD. The present invention is also applicable to a clock recovery circuit for generating a reproduce clock based on phase information about a reproduce or playback signal read from a recording medium, which is employed in each of other recording or reproducing apparatuses such as a mini-disk driving device, a digital VTR, a digital VCR, etc.

In the PLL circuit according to the present invention, as has been described above, the first and second pulse output circuits for respectively outputting the pulse currents corresponding to the phase information about the input signal are provided. The voltage outputted from the integration circuit corresponding to the stage subsequent to the first pulse output circuit is converted into the current by the voltage-to-current conversion circuit. Further, the converted current and the output current of the second pulse output circuit are added together by the adder and the added output is supplied to the voltage-controlled oscillator as the control input. Thus, since the circuit identical to the loop filter of CR can be configured equivalently, the PLL circuit suitable for the implementation of an IC can be obtained.

In the recording or reproducing apparatus according to the present invention, the PLL circuit having the above construction is used as the clock recovery circuit for generating the reproduce clock, based on the phase information about the playback signal read from the recording medium. Therefore, since the corresponding PLL circuit is suitable for the implementation of the IC, the entire system can be rendered compact in size and reduced in cost.

Further, in the recording or reproducing apparatus according to the present invention, the frequency control information of the write clock generating circuit is used as the information for controlling the frequency of the reproduce clock generated by the clock recovery circuit. Thus, since the frequency of the reproduce clock is varied so as to follow the frequency of the write clock, the natural angular frequency ωn proportional to the data rate can be obtained even without special control on the clock recovery circuit side.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A recording or reproducing apparatus comprising:

means for reading and writing information from and to a recording medium;

a write clock signal generating circuit for generating a write clock signal for writing information into the recording medium through said reading and writing means, and a clock recovery circuit for generating a reproduce clock signal, based on phase information about a reproduce signal received from the recording medium through said reading and writing means, said clock recovery circuit controlling the frequency of the reproduce clock signal in response to frequency of the write clock signal outputted from said write clock signal generating circuit.

2. A recording or reproducing apparatus according to claim 1, wherein said clock recovery circuit comprises:

a phase detector for detecting the phase information about the reproduce signal;

a first pulse output circuit for outputting a pulse current corresponding to the phase information outputted from said phase detector;

a second pulse output circuit for outputting a pulse current corresponding to the phase information outputted from said phase detector;

an integration circuit connected between an output terminal of said first pulse output circuit and a reference potential point;

a voltage-to-current conversion circuit for converting a voltage outputted from said integration circuit into a current;

an adder for adding the output current of said voltage-to-current conversion circuit and the output current of said second pulse output circuit; and a voltage-controlled oscillator for changing oscillation frequency in response to the added output of said adder.

3. A recording or reproducing apparatus according to claim 2, wherein said phase detector is a phase comparator for comparing the phases of the frequency of the input signal and the oscillation frequency of said voltage-controlled oscillator, and said first and second pulse output circuits are charge pump circuits for respectively outputting pulse currents having pulse widths in response to phase-error information outputted from said phase comparator.

4. A recording or reproducing apparatus according to claim 2, wherein said first and second pulse output circuits are digital/analog converters for respectively outputting pulse currents having crest values in response to the phase information outputted from said phase detector.

* * * * *